United States Patent
Masleid et al.

(10) Patent No.: US 7,592,836 B1
(45) Date of Patent: Sep. 22, 2009

(54) MULTI-WRITE MEMORY CIRCUIT WITH MULTIPLE DATA INPUTS

(76) Inventors: Robert P. Masleid, 17266 Eaton La., Monte Sereno, CA (US) 95930; Scott Pitkethly, 435 Avenue Del Ora, Redwood City, CA (US) 94062

(*) Notice: Subject to any disclaimer, the term of this patent is extended or adjusted under 35 U.S.C. 154(b) by 36 days.

(21) Appl. No.: 11/396,114

(22) Filed: Mar. 31, 2006

(51) Int. Cl.
  *G06F 7/38* (2006.01)
  *H03K 19/173* (2006.01)
  *H03K 3/00* (2006.01)
  *G11C 11/00* (2006.01)

(52) U.S. Cl. .......................... 326/46; 327/217; 365/154

(58) Field of Classification Search ................ 326/46, 326/93–98, 104, 112, 201–203, 208–218; 365/154, 205
See application file for complete search history.

(56) References Cited

U.S. PATENT DOCUMENTS

| | | | | |
|---|---|---|---|---|
| 4,554,465 A | * | 11/1985 | Koike | 327/258 |
| 4,641,044 A | * | 2/1987 | Shiraishi | 327/142 |
| 4,877,974 A | * | 10/1989 | Kawai et al. | 327/239 |
| 5,321,399 A | | 6/1994 | Notani et al. | |
| 5,828,256 A | * | 10/1998 | Kurisu | 327/161 |
| 6,064,247 A | * | 5/2000 | Krakirian | 327/295 |
| 6,188,262 B1 | * | 2/2001 | Sutherland | 327/295 |
| 6,211,702 B1 | | 4/2001 | Nagatome | |
| 6,501,315 B1 | * | 12/2002 | Nguyen | 327/217 |
| 6,501,327 B1 | * | 12/2002 | Tam | 327/538 |
| 6,737,897 B2 | * | 5/2004 | Gomm et al. | 327/158 |
| 7,091,742 B2 | | 8/2006 | Ryan | |
| 2003/0188241 A1 | | 10/2003 | Zyuban et al. | |
| 2004/0076041 A1 | | 4/2004 | Akiyoshi | |

FOREIGN PATENT DOCUMENTS

JP 09244585 9/1997

OTHER PUBLICATIONS

Hamid Mahmoodi-Meimand and Kaushik Roy, "Data-Retention Flip-Flops for Power-Down Applications", Retrieved from Internet: http://ieeexplore.ieee.org/iel5/9255/29377/01329362.pdf, the whole document.
Advisory Action, Mail Date: Apr. 17, 2009; U.S. Appl. No. 11/395,517.
Final Office Action, Mail Date: Feb. 11, 2009; U.S. Appl. No. 11/395,517.
Non Final Office Action, Mail Date: Jul. 29, 2008; U.S. Appl. No. 11/395,517.
Non Final Office Action, Mail Date: Jul. 25, 2007; U.S. Appl. No. 11/395,517.

(Continued)

*Primary Examiner*—Vibol Tan
*Assistant Examiner*—M. C. T.

(57) ABSTRACT

Various types of memory circuits are described. A memory circuit may include a state-storage feedback loop coupled to a first data input and to a second data input. The first data input is introduced into the feedback loop at a first set of points, and the second data input is introduced into the feedback loop at a second set of points.

14 Claims, 8 Drawing Sheets

OTHER PUBLICATIONS

Final Office Action, Mail Date: Feb. 08, 2008; U.S. Appl. No. 11/395,517.

Meimand-Mahmoodi Hamid, et al.; "Data-Retention Flip-Flops for Power-Down Application", School of Electrical and Computer Engineering, Purdue Universtiy West Lafayette, IN, USA, 2004 IEEE, pp. 677-680.

PCT Search Report, International Application No. PCT/US2007/007930, International Filing Date: Sep. 17, 2007.

PCT Preliminary Report on Patentability, International Application No. PCT/US2007/0007930; International Filling Date: Mar. 30, 2007.

Non-Final Office Action Mailed Jun. 19, 2009; U.S. Appl. No. 11/395,017.

* cited by examiner

1910
RECEIVE A CLOCK INPUT AT A FIRST SET OF POINTS IN A FEEDBACK LOOP OF A MEMORY CIRCUIT

↓

1920
RECEIVE AN INPUT STATE AT A SECOND SET OF POINTS IN THE FEEDBACK LOOP

↓

1930
PROPAGATE THE INPUT STATE TO OTHER POINTS IN THE FEEDBACK LOOP

2010
RECEIVE A FIRST DATA INPUT AT A FIRST SET OF POINTS IN A FEEDBACK LOOP OF A MEMORY CIRCUIT

↓

2020
RECEIVE A SECOND DATA INPUT AT A SECOND SET OF POINTS IN THE FEEDBACK LOOP

↓

2030
PROPAGATE THE FIRST AND SECOND DATA INPUTS TO OTHER POINTS IN THE FEEDBACK LOOP

FIG. 18

MULTI-WRITE MEMORY CIRCUIT WITH MULTIPLE DATA INPUTS

RELATED APPLICATION

This application is related to U.S. patent application Ser. No. 11/395,017 by R. Masleid, filed on Mar. 31, 2006, entitled "Multi-Write Memory Circuit with a Data Input and a Clock Input," assigned to the assignee of the present invention, and hereby incorporated by reference in its entirety.

BACKGROUND OF THE INVENTION

1. Field of the Invention

Embodiments of the present invention relate to electronic circuits, in particular memory circuits.

2. Related Art

In general, a memory circuit is a type of circuit whose output depends on both the input to the circuit and the circuit's previous state (the state prior to the input). A feedback loop included in a memory circuit allows a previous input, along with a current input, to affect the current output.

A memory circuit that can reduce the time needed to secure a new state in the circuit would be advantageous.

SUMMARY OF THE INVENTION

Embodiments in accordance with the present invention pertain to different types of electronic circuits. In particular, various embodiments of memory circuits are described. In one embodiment, a memory circuit includes a state-storage feedback loop coupled to a first data input and to a second data input. The first data input is introduced into the feedback loop at a first set of points, and the second data input is introduced into the feedback loop at a second set of points. The first and second data inputs are propagated in parallel to other points in the feedback loop.

BRIEF DESCRIPTION OF THE DRAWINGS

The accompanying drawings, which are incorporated in and form a part of this specification, illustrate embodiments of the present invention and, together with the description, serve to explain the principles of the invention. The drawings referred to in this description should not be understood as being drawn to scale except if specifically noted.

DETAILED DESCRIPTION OF THE INVENTION

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Memory circuits in accordance with the present invention may be implemented as latches or flip-flops. In general, the memory circuits described herein are devices that store one bit.

Reduced Vmin Circuits with a Data Input and a Clock Input

Figure 1:
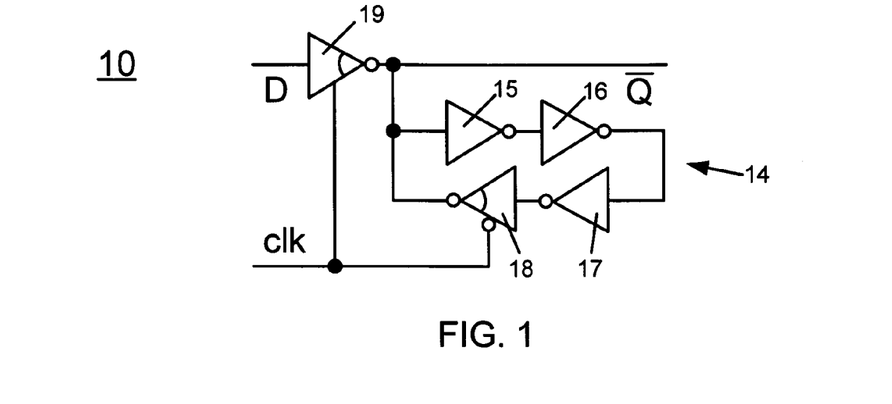
FIGS. 1 and 2 illustrate embodiments of a memory circuit having a data input and a clock input and reduced minimum retention voltage in accordance with the present invention.

FIG. 1 is a schematic of a memory circuit 10 having a data input D, a control input (e.g., clock input clk), and an output Q-bar in accordance with one embodiment of the present invention. In comparison to a conventional memory circuit, the state-storage feedback loop 14 of circuit 10 includes additional elements; the additional elements may be referred to collectively as a redundant element. Specifically, in addition to inverter 15 and three-state inverter 18, the feedback loop 14 includes inverters 16 and 17. The inverters 16 and 17 affect the statistical and electrical behavior of the circuit, and in particular statistically lower the minimum retention voltage (Vmin) of the circuit 10, where Vmin is the minimum voltage at which state can be successfully retained by a memory circuit such as circuit 10. Reducing Vmin may also reduce standby voltage, and consequently may reduce standby leakage and standby power. Furthermore, reducing Vmin may reduce the sensitivity of circuit 10 to transistor mismatch that can occur during fabrication. Also, in comparison to a conventional memory circuit, circuit 10 advantageously has a greater static noise margin (SNM).

Figure 2:
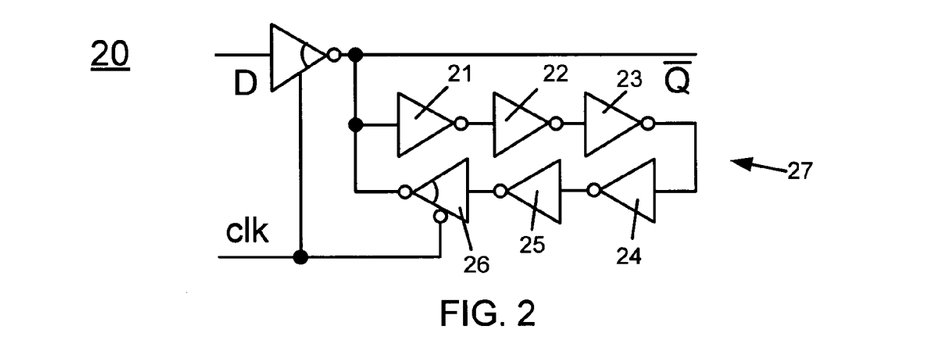

FIG. 2 is a schematic of a memory circuit 20 having a data input D, a clock input clk, and an output Q-bar in accordance with another embodiment of the present invention. In comparison to feedback loop 14 of FIG. 1, the state-storage feedback loop 27 of circuit 20 includes additional elements. Specifically, in addition to inverter 21 and three-state inverter 26, the feedback loop 27 includes inverters 21, 22, 23 and 24. The extended length of feedback loop 27 relative to feedback loop 14 can enhance the advantages mentioned above.

Figure 3:
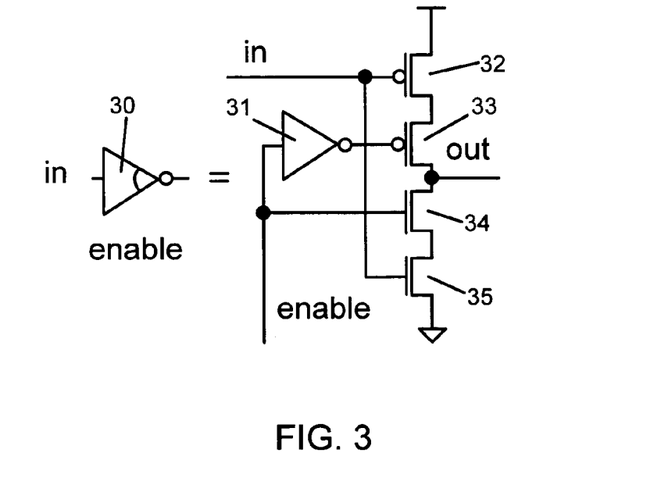
FIGS. 3 and 4 illustrate embodiments of a three-state inverter in accordance with the present invention.

FIG. 3 is a schematic of an embodiment of a three-state inverter 30 in accordance with the present invention. Three-state inverter 30 includes multiple p-type devices and multiple n-type devices (transistors). The p-type devices are configured to pull the output high (when appropriate) and the n-type devices are configured to pull the output low. Consequently, the drive capability of three-state inverter 30 is less than the drive capability of a conventional inverter.

In the example of FIG. 3, three-state inverter 30 includes two p-type devices 32 and 33, and two n-type devices 34 and 35. The gates of devices 32 and 35 are coupled to the input. The gate of device 33 is coupled to the output of an inverter 31, which receives an enable signal, and the gate of device 34 is also coupled to the enable input. In the example of FIG. 3, when the enable signal is high, then the output is driven.

Figure 4:
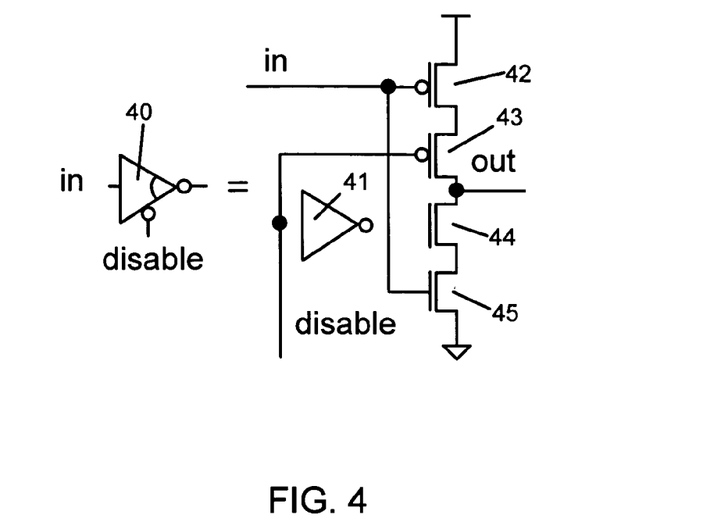

FIG. 4 is a schematic of another embodiment of a three-state inverter 40 in accordance with the present invention. In the example of FIG. 4, three-state inverter 40 includes two p-type devices 42 and 43, and two n-type devices 44 and 45. The gates of devices 42 and 45 are coupled to the input. The gate of device 44 is coupled to the output of an inverter 41, which receives a disable signal, and the gate of device 43 is also coupled to the disable input. In the example of FIG. 4, when the disable signal is low, then the output is driven.

Multi-Write Reduced Vmin Circuits with a Data Input and a Clock Input

Figure 5:
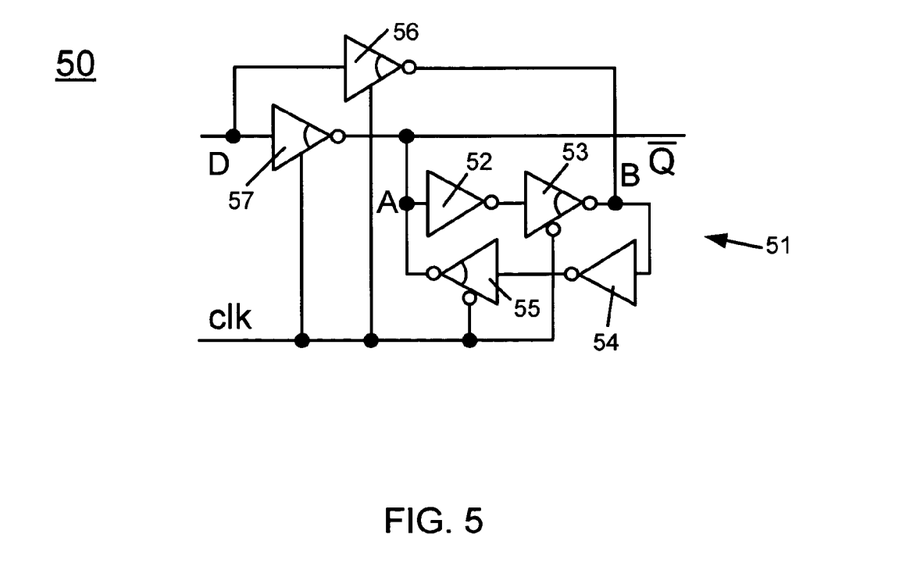
FIGS. 5, 6, 7 and 8 illustrate embodiments of a multi-write memory circuit having a data input and a clock input and reduced minimum retention voltage in accordance with the present invention.

FIG. 5 is a schematic of a multi-write memory circuit 50 having a data input D, a clock input clk, and an output O-bar. The state-storage feedback loop 51 of circuit 50 includes an inverter 52, a three-state inverter 53, an inverter 54 and a three-state inverter 55, coupled in series. The inverter 54 and the three-state inverter 55 constitute a redundant element that reduces the minimum retention voltage of circuit 50. Circuit 50 may be referred to as a multi-write quad Vmin latch.

The three-state inverters 53 and 55 each have a clock input that, in the embodiment of FIG. 5, provides a disable signal to the three-state inverters 53 and 55. A data input of the three-state inverter 53 is coupled to an output of the inverter 52, and a data input of the three-state inverter 55 is coupled to an output of the inverter 54. The three-state inverters 53 and 55 buffer the state received from the inverters 52 and 54, respectively, subject to the state of a clock signal.

In one embodiment, a three-state inverter 56 is coupled between the data input D and inverter 54, and a three-state inverter 57 is coupled between the data input D and inverter 52. The three-state inverters 56 and 57 each have a clock input that, in the embodiment of FIG. 5, provides an enable signal to the three-state inverters 56 and 57.

Significantly, according to the present embodiment of the present invention, the data input signal D is sensed in parallel by both the inverter 52 and the inverter 54. That is, according to the present embodiment of the present invention, the data input D is written (or driven or loaded) in parallel into feedback loop 51 at multiple locations, labeled A and B, instead of in just one location. An update of the remainder of feedback loop 51 proceeds in parallel from each of the write locations A and B.

The feedback loop 14 of circuit 10 (FIG. 1) is similar to the feedback loop 51 of FIG. 5. However, in contrast to circuit 50, data is written to feedback loop 14 of circuit 10 at just one location, and thus the time needed to update feedback loop 14 is essentially the time it takes for an input signal to be propagated around feedback loop 14. Feedback loop 14 is updated in four inversions, while feedback loop 51 is updated in two inversions. Consequently, feedback loop 51 is updated in about half the time that would be needed to update feedback loop 14; it is recognized that some speed may be lost in a longer feedback loop due to increased parasitic side loads.

In general, according to embodiments of the present invention, a state-storage feedback loop of a reduced Vmin memory circuit can be updated in less time. Thus, according to embodiments of the present invention, the time (e.g., hold time, setup time, or some other measure) needed to secure a new state in the memory circuit is reduced, in this respect improving the performance of reduced Vmin memory circuits.

Figure 6:
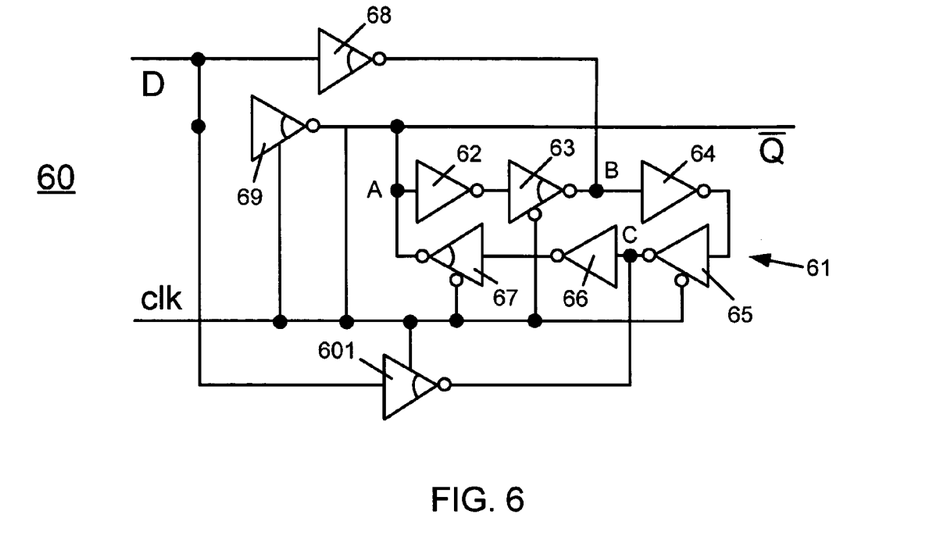
Figure 7:
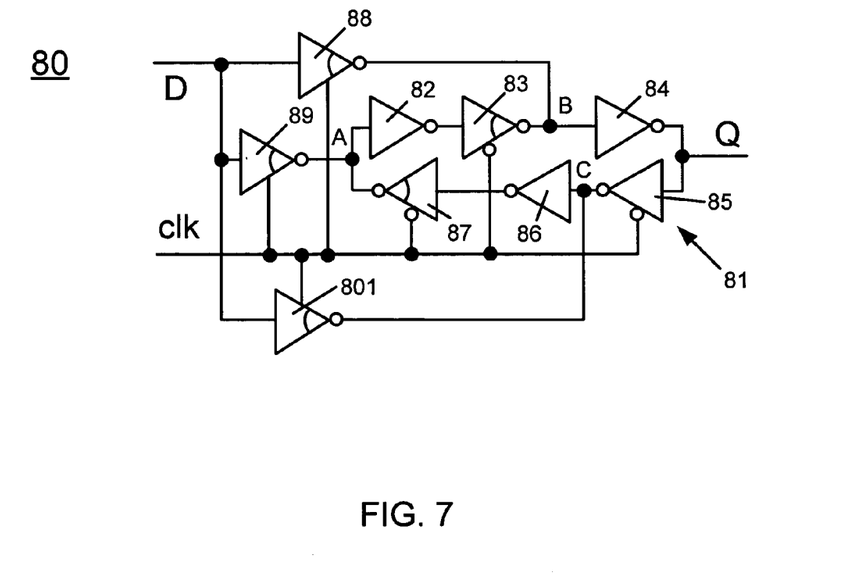
Figure 8:
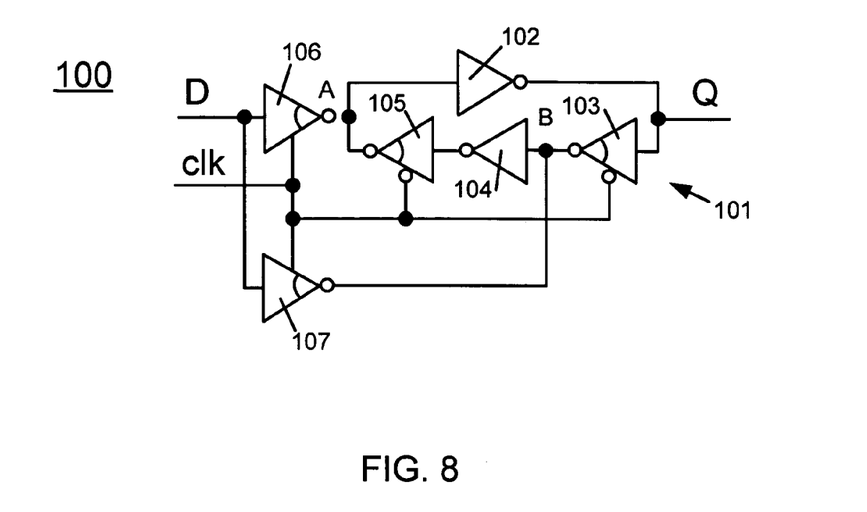

FIGS. 6, 7 and 8 are schematics of other embodiments of a multi-write memory circuit having a data input and a clock input and reduced minimum retention voltage in accordance with the present invention. In FIG. 6, the state-storage feedback loop 61 of memory circuit 60 includes an inverter 62, a three-state inverter 63, an inverter 64, a three-state inverter 65, an inverter 66 and a three-state inverter 67, coupled in series. The inverter 64, three-state inverter 65, inverter 66 and three-state inverter 67 constitute a redundant element that reduces the minimum retention voltage of circuit 60. Circuit 60 may be referred to as a multi-write hex Vmin latch.

The three-state inverters 63, 65 and 67 each have a clock input that, in the embodiment of FIG. 6, provides a disable signal to the three-state inverters 63, 65 and 67. A data input of the three-state inverter 63 is coupled to an output of the inverter 62, a data input of the three-state inverter 65 is coupled to an output of the inverter 64, and a data input of the three-state inverter 67 is coupled to an output of the inverter 66. The three-state inverters 63, 65 and 67 buffer the state received from the inverters 62, 64 and 66, respectively, subject to the state of a clock signal.

In one embodiment, a three-state inverter 68 is coupled between the data input D and inverter 64, a three-state inverter 69 is coupled between the data input D and inverter 62, and a three-state inverter 601 is coupled between the data input D and inverter 66. The three-state inverters 68, 69 and 601 each have a clock input that, in the embodiment of FIG. 6, provides an enable signal to the three-state inverters 68, 69 and 601.

According to the present embodiment of the present invention, the data input D is written in parallel into feedback loop 61 at multiple locations, labeled A, B and C, instead of in just one location. An update of the remainder of feedback loop 61 proceeds in parallel from each of the write locations A, B and C. Thus, like feedback loop 51 of FIG. 5, feedback loop 61 is updated in two inversions, despite the extended length of feedback loop 61 relative to feedback loop 51.

In FIG. 7, the state-storage feedback loop 81 of memory circuit 80 includes an inverter 82, a three-state inverter 83, an inverter 84, a three-state inverter 85, an inverter 86 and a three-state inverter 87, coupled in series. The inverter 84, three-state inverter 85, inverter 86 and three-state inverter 87 constitute a redundant element that reduces the minimum retention voltage of circuit 80. Circuit 80 may be referred to as a multi-write series hex Vmin latch.

The three-state inverters 83, 85 and 87 each have a clock input that, in the embodiment of FIG. 7, provides a disable signal to the three-state inverters 83, 85 and 87. A data input of the three-state inverter 83 is coupled to an output of the inverter 82, a data input of the three-state inverter 85 is coupled to an output of the inverter 84, and a data input of the three-state inverter 87 is coupled to an output of the inverter 86. The three-state inverters 83, 85 and 87 buffer the state received from the inverters 82, 84 and 86, respectively, subject to the state of a clock signal.

In one embodiment, a three-state inverter 88 is coupled between the data input D and inverter 84, a three-state inverter 89 is coupled between the data input D and inverter 82, and a three-state inverter 801 is coupled between the data input D and inverter 86. The three-state inverters 88, 89 and 801 each have a clock input that, in the embodiment of FIG. 7, provides an enable signal to the three-state inverters 88, 89 and 801.

According to the present embodiment of the present invention, the data input D is written in parallel into feedback loop 81 at multiple locations, labeled A, B and C, instead of in just one location. An update of the remainder of feedback loop 81 proceeds in parallel from each of the write locations A, B and C. Thus, as in the examples above, feedback loop 81 is updated in two inversions, despite the extended length of feedback loop 81 relative to some of those examples.

In FIG. 8, the state-storage feedback loop 101 of memory circuit 100 includes an inverter 102, a three-state inverter 103, an inverter 104 and a three-state inverter 105, coupled in series. The inverter 104 and three-state inverter 105 constitute a redundant element that reduces the minimum retention voltage of circuit 100. Circuit 100 may be referred to as a multi-write series-inversion Vmin latch.

The three-state inverters 103 and 105 each have a clock input that, in the embodiment of FIG. 8, provides a disable signal to the three-state inverters 103 and 105. A data input of the three-state inverter 103 is coupled to an output of the inverter 102, and a data input of the three-state inverter 105 is coupled to an output of the inverter 104. The three-state inverters 103 and 105 buffer the state received from the inverters 102 and 104, respectively, subject to the state of a clock signal.

In one embodiment, a three-state inverter 106 is coupled between the data input D and inverter 102, and a three-state inverter 107 is coupled between the data input D and inverter 104. The three-state inverters 106 and 107 each have a clock input that, in the embodiment of FIG. 8, provides an enable signal to the three-state inverters 106 and 107.

According to the present embodiment of the present invention, the data input D is written in parallel into feedback loop 101 at multiple locations, labeled A and B, instead of in just one location. An update of the remainder of feedback loop 61 proceeds in parallel from each of the write locations A and B. Thus, like the examples above, feedback loop 101 is updated in two inversions.

Embodiments in accordance with the present invention are not limited to the examples described by FIGS. 5-8 above. In general, embodiments in accordance with the present invention introduce a data input into multiple points on a state-storage feedback loop. Accordingly, a feedback loop of arbitrary length can be updated in as few as two inversions, depending on the number of write locations.

In one embodiment, the feedback loop includes an even number of circuit elements (e.g., inverters and three-state inverters) coupled in series. In one such embodiment, the feedback loop includes a same number of inverters and three-state inverters coupled alternately in series. Using circuit 50 of FIG. 5 as an example, feedback loop 51 includes, in order, inverter 52, three-state inverter 53, inverter 54 and three-state inverter 55. The data input is introduced into feedback loop 51 at the inputs of the inverters 52 and 54, which alternate with three-state inverters 53 and 55 in feedback loop 51, and the three-state inverters 53 and 55 buffer the state output by the inverters 52 and 54, subject to the clock signal clk.

From another perspective, the state-storage feedback loop can be viewed as having a number of stages where, in one embodiment, each stage includes a first element (e.g., an inverter) and a second element (e.g., a three-state inverter) coupled in series. In one such embodiment, each stage has a clock input and a data input, where a state on the data input is written in parallel into each of the stages.

The multi-write reduced Vmin circuits of FIGS. 5-8 can be used in combination with the reduced Vmin circuits of FIGS. 1-2. Because a multi-write Vmin circuit may have larger data and clock input capacitances than a reduced Vmin circuit, and thus may slightly increase power dissipation within the feedback loop, it may be appropriate to use multi-write reduced Vmin circuits in critical paths (for speed) and reduced Vmin circuits in non-critical paths (to conserve power).

Reduced Vmin Circuits with First and Second Data Inputs

Figure 9:
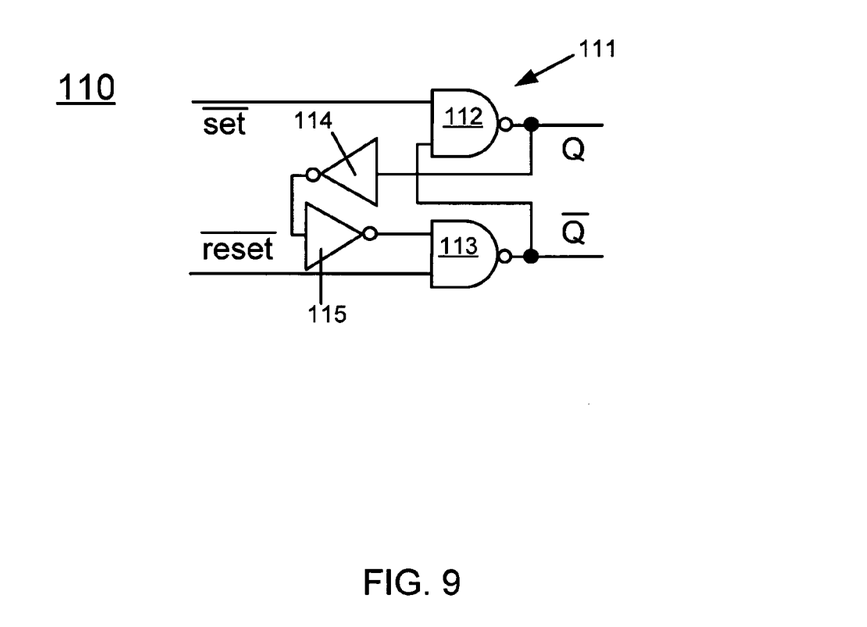
FIGS. 9 and 10 illustrate embodiments of a memory circuit having first and second data inputs and reduced minimum retention voltage in accordance with the present invention.

FIG. 9 is a schematic of a memory circuit 110 having a first data input set-bar, a second data input reset-bar, a first output Q, and a second output O-bar in accordance with one embodiment of the present invention. In comparison to a conventional memory circuit, the state-storage feedback loop 111 of circuit 110 includes additional elements (which may be referred to collectively as a redundant element). Specifically, in addition to NAND gates 112 and 113, the feedback loop 111 includes inverters 114 and 115. The inverters 114 and 115 affect the statistical and electrical behavior of the circuit, and in particular statistically lower the Vmin of the circuit 110. As mentioned previously herein, reducing Vmin may also reduce standby voltage, and consequently may reduce standby leakage and standby power. Furthermore, reducing Vmin may reduce the sensitivity of circuit 110 to transistor mismatch that can occur during fabrication. Also, in comparison to a conventional memory circuit, circuit 110 advantageously has a greater SNM.

Figure 10:
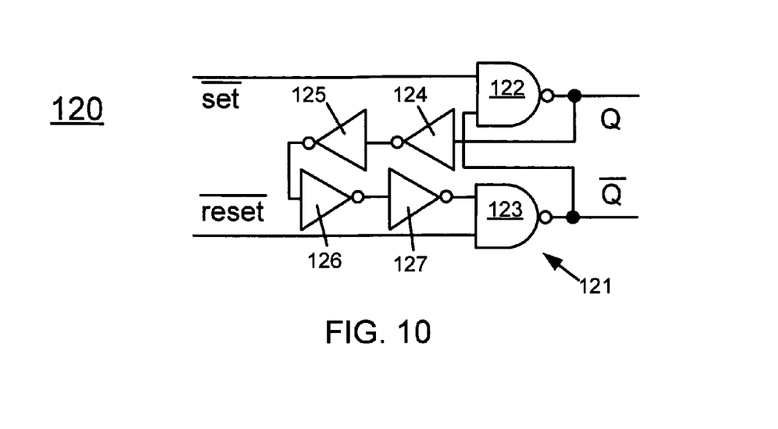

FIG. 10 is a schematic of a memory circuit 120 having a first data input set-bar, a second data input reset-bar, a first output Q, and a second output Q-bar in accordance with another embodiment of the present invention. In comparison to feedback loop 111 of FIG. 9, the state-storage feedback loop 121 of circuit 120 includes additional elements. Specifically, in addition to NAND gates 122 and 123, the feedback loop 121 includes inverters 124, 125, 126 and 126. The extended length of feedback loop 121 relative to feedback loop 111 can enhance the advantages mentioned above.

Reduced Vmin Multi-Write Circuits with First and Second Data Inputs

Figure 11:
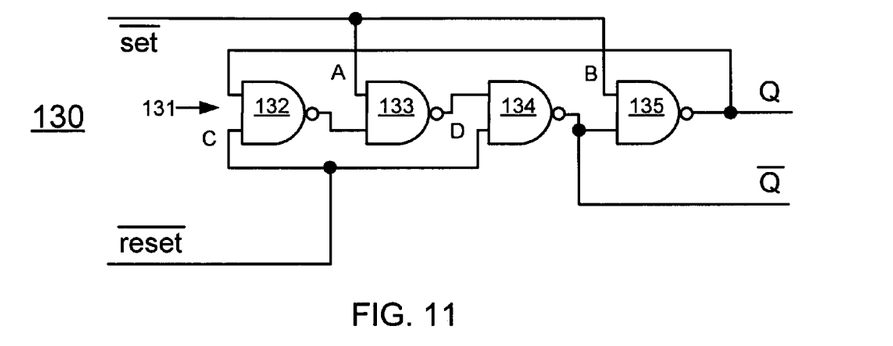
FIGS. 11, 12, 13, 14, 15 and 16 illustrate embodiments of a multi-write memory circuit having first and second data inputs and reduced minimum retention voltage in accordance with the present invention.

FIG. 11 is a schematic of a multi-write memory circuit 130 having a first data input set-bar, a second data input reset-bar, a first output Q, and a second output Q-bar in accordance with another embodiment of the present invention. Circuit 130 may be referred to as a multi-write reduced Vmin set-reset latch.

The state-storage feedback loop 131 of circuit 130 includes NAND gates 132, 133, 134 and 135, coupled in series. The NAND gates 134 and 135 constitute a redundant element that reduces the minimum retention voltage of circuit 130.

Significantly, according to the present embodiment of the present invention, the data input signal set-bar is sensed in parallel by both NAND gate 133 and NAND gate 135, and the data input signal reset-bar is sensed in parallel by both NAND gate 132 and NAND gate 134. That is, according to the present embodiment of the present invention, the set-bar signal is written in parallel into feedback loop 131 at multiple locations, labeled A and B, instead of in just one location, and the reset-bar signal is written in parallel into feedback loop 131 at multiple locations, labeled C and D, instead of in just one location. Signals proceed in parallel through feedback loop 131 from each of the write locations A, B, C and D.

Thus, the time needed to update feedback loop 131 is less than the propagation time around a conventional feedback loop (that is, a feedback loop having only a single write location). Feedback loop 131 is updated in two inversions; if there was only a single write location, then it would take four inversions to update the feedback loop.

In general, according to embodiments of the present invention, a state-storage feedback loop of a reduced Vmin memory circuit is updated in less time than the propagation time around the feedback loop. Thus, according to embodiments of the present invention, the time (e.g., hold time, setup time, or some other measure) needed to secure a new state in the memory circuit is reduced, in this respect improving the performance of reduced Vmin memory circuits.

Figure 12:
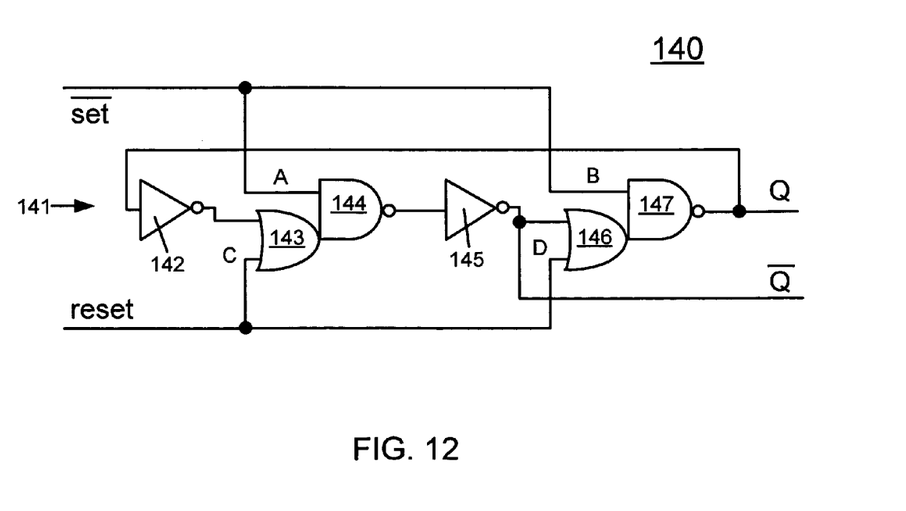

FIGS. 12, 13, 14, 15 and 16 are schematics of other embodiments of a multi-write memory circuit having first and second data inputs and reduced minimum retention voltage in accordance with the present invention. In FIG. 12, the state-storage feedback loop 141 of circuit 140 includes an inverter 142, an OR-AND invert (OAI) stage that includes OR gate 143 and NAND gate 144, an inverter 145, and another OAI stage that includes OR gate 146 and NAND gate 147, coupled in series. The inverter 145, the OR gate 146 and the NAND gate 147 constitute a redundant element that reduces the minimum retention voltage of circuit 140. Circuit 140 may be referred to as a quad inversion OAI multi-write Vmin set-reset latch.

According to the present embodiment of the present invention, the data input signal set-bar is sensed in parallel by both NAND gate 144 and NAND gate 147, and the data input signal reset is sensed in parallel by both OR gate 143 and OR gate 146. That is, according to the present embodiment of the present invention, the set-bar signal is written in parallel into feedback loop 141 at multiple locations, labeled A and B, instead of in just one location, and the reset signal is written in parallel into feedback loop 141 at multiple locations, labeled C and D, instead of in just one location. Signals proceed in parallel through feedback loop 141 from each of the write locations A, B, C and D. Thus, feedback loop 141 is updated in two inversions, despite the presence of the redundant element.

Figure 13:
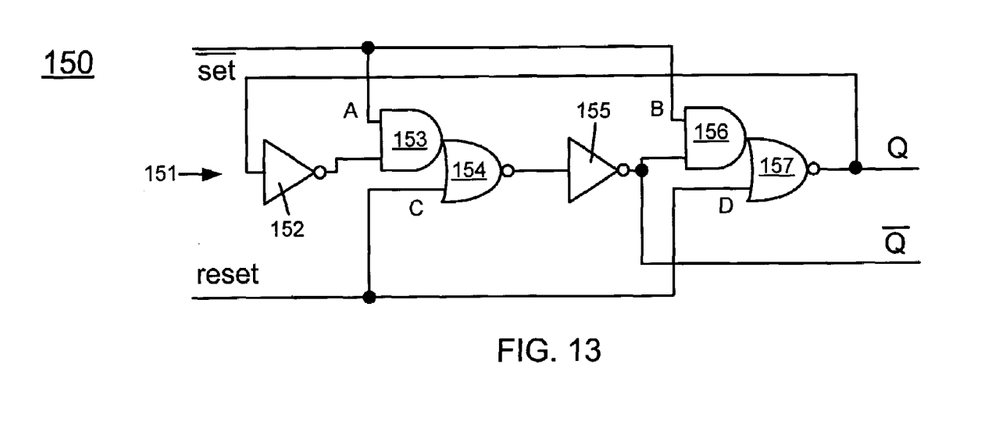

In FIG. 13, the state-storage feedback loop 151 of circuit 150 includes an inverter 152, an AND-OR invert (AOI) stage that includes AND gate 153 and NOR gate 154, an inverter 155, and another AOI stage that includes AND gate 156 and NOR gate 157, coupled in series. The inverter 155, the AND gate 156 and the NOR gate 157 constitute a redundant element that reduces the minimum retention voltage of circuit 150. Circuit 150 may be referred to as a quad inversion AOI multi-write Vmin set-reset latch.

According to the present embodiment of the present invention, the data input signal set-bar is sensed in parallel by both AND gate 153 and AND gate 156, and the data input signal reset is sensed in parallel by both NOR gate 154 and NOR gate 157. That is, according to the present embodiment of the present invention, the set-bar signal is written in parallel into feedback loop 151 at multiple locations, labeled A and B, instead of in just one location, and the reset signal is written in parallel into feedback loop 151 at multiple locations, labeled C and D, instead of in just one location. Signals proceed in parallel through feedback loop 151 from each of the write locations A, B, C and D. Thus, feedback loop 151 is updated in two inversions, despite the presence of the redundant element.

Figure 14:
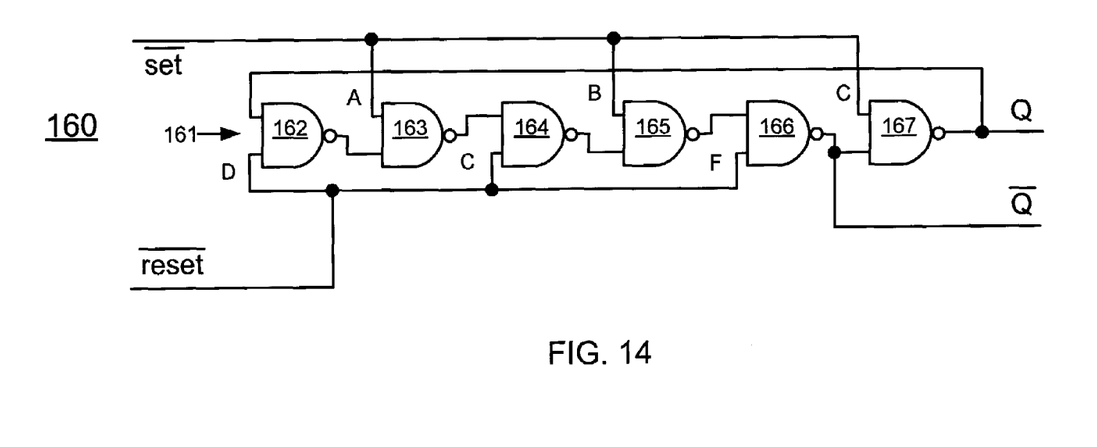

In FIG. 14, the state-storage feedback loop 161 of circuit 160 includes NAND gates 162, 163, 164, 165, 166 and 167, coupled in series. The NAND gates 164, 165, 166 and 167 constitute a redundant element that reduces the minimum retention voltage of circuit 160. Circuit 160 may be referred to as a hex NAND multi-write Vmin set-reset latch.

According to the present embodiment of the present invention, the data input signal set-bar is sensed in parallel by NAND gates 163, 165 and 167, and the data input signal reset-bar is sensed in parallel by NAND gates 162, 164 and 166. That is, according to the present embodiment of the present invention, the set-bar signal is written in parallel into feedback loop 161 at multiple locations, labeled A, B and C, instead of in just one location, and the reset-bar signal is written in parallel into feedback loop 161 at multiple locations, labeled D, E and F, instead of in just one location. Signals proceed in parallel through feedback loop 161 from each of the write locations A, B, C, D, E and F. Thus, feedback loop 161 is updated in two inversions, despite the presence of the redundant element.

Figure 15:
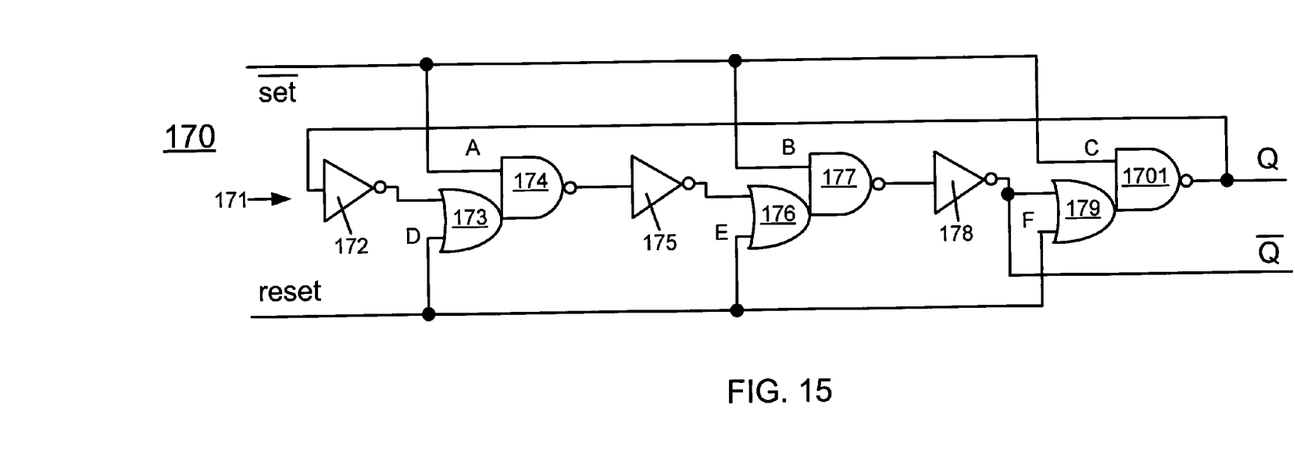

In FIG. 15, the state-storage feedback loop 171 of circuit 170 includes an inverter 172, an OAI stage that includes OR gate 173 and NAND gate 174, an inverter 175, an OAI stage that includes OR gate 176 and NAND gate 177, an inverter 178, and an OAI stage that includes OR gate 179 and NAND gate 1701, coupled in series. The inverters 175 and 178, the OR gates 176 and 179, and the NAND gates 177 and 1701 constitute a redundant element that reduces the minimum retention voltage of circuit 170. Circuit 170 may be referred to as a hex inversion OAI multi-write Vmin set-reset latch.

According to the present embodiment of the present invention, the data input signal set-bar is sensed in parallel by NAND gates 174, 177 and 1701, and the data input signal reset is sensed in parallel by OR gates 173, 176 and 179. That is, according to the present embodiment of the present invention, the set-bar signal is written in parallel into feedback loop 171 at multiple locations, labeled A, B and C, instead of in just one location, and the reset signal is written in parallel into feedback loop 171 at multiple locations, labeled D, E and F, instead of in just one location. Signals proceed in parallel through feedback loop 171 from each of the write locations A, B, C, D, E and F. Thus, feedback loop 171 is updated in two inversions, despite the presence of the redundant element.

Figure 16:
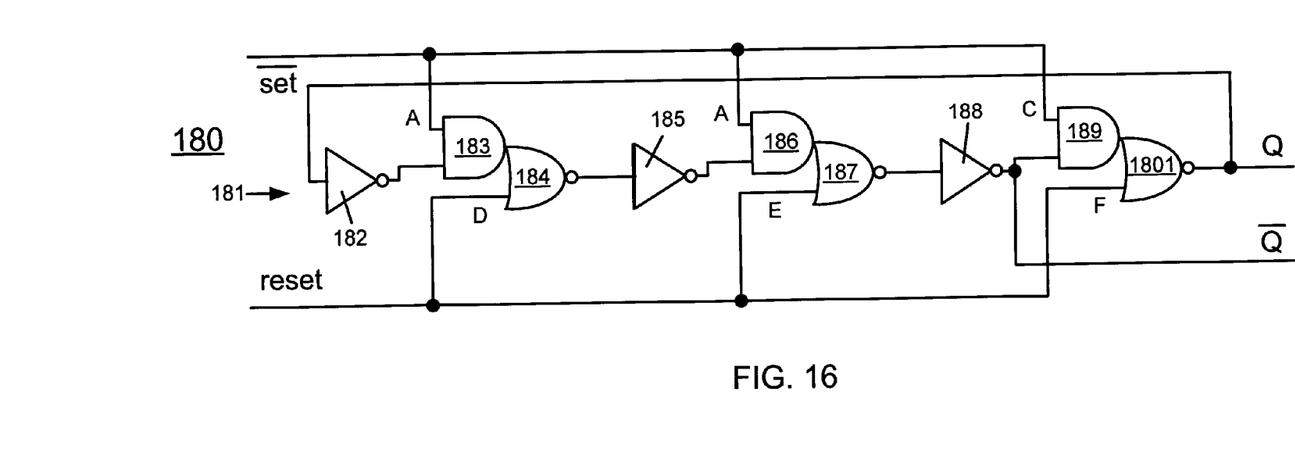

In FIG. 16, the state-storage feedback loop 181 of circuit 180 includes an inverter 182, an AOI stage that includes AND gate 183 and NOR gate 184, an inverter 185, and an AOI stage that includes AND gate 186 and NOR gate 187, an inverter 188, and an AOI stage that includes AND gate 189 and NOR gate 1801, coupled in series. The inverters 185 and 188, the AND gates 186 and 189, and the NOR gates 187 and 1801 constitute a redundant element that reduces the minimum retention voltage of circuit 180. Circuit 180 may be referred to as a hex inversion AOI multi-write Vmin set-reset latch.

According to the present embodiment of the present invention, the data input signal set-bar is sensed in parallel by AND gates 183, 186 and 189, and the data input signal reset is sensed in parallel by NOR gates 184, 187 and 1801. That is, according to the present embodiment of the present invention, the set-bar signal is written in parallel into feedback loop 181 at multiple locations, labeled A, B and C, instead of in just one location, and the reset signal is written in parallel into feedback loop 181 at multiple locations, labeled D, E and F, instead of in just one location. Signals proceed in parallel through feedback loop 181 from each of the write locations A, B, C, D, E and F. Thus, feedback loop 181 is updated in two inversions, despite the presence of the redundant element.

Embodiments in accordance with the present invention are not limited to the examples described by FIGS. 11-16 above. In general, embodiments in accordance with the present invention introduce first and second data inputs into multiple points on a state-storage feedback loop. Accordingly, a feedback loop of arbitrary length can be updated in as few as two inversions, depending on the number of write locations.

In one embodiment, the feedback loop includes an even number of circuit elements (e.g., gates) coupled in series. In one embodiment, a first data input is introduced into the feedback loop at the inputs of alternate circuit elements (e.g., at the input of every other gate in the feedback loop), and a second data input is introduced into the feedback loop at the circuit elements between the alternate circuit elements.

From another perspective, the state-storage feedback loop can be viewed as having a number of stages, where the first data input is written in parallel into each of the stages, and where the second data input is also written in parallel into each of the stages.

The multi-write reduced Vmin circuits of FIGS. 11-16 can be used in combination with the reduced Vmin circuits of FIGS. 9-10. Because a multi-write Vmin circuit may have larger data capacitances than a reduced Vmin circuit, and thus may slightly increase power dissipation within the feedback loop, it may be appropriate to use multi-write reduced Vmin circuits in critical paths (for speed) and reduced Vmin circuits in non-critical paths (to conserve power).

Methods for Writing State to Memory Circuits

Figure 17:
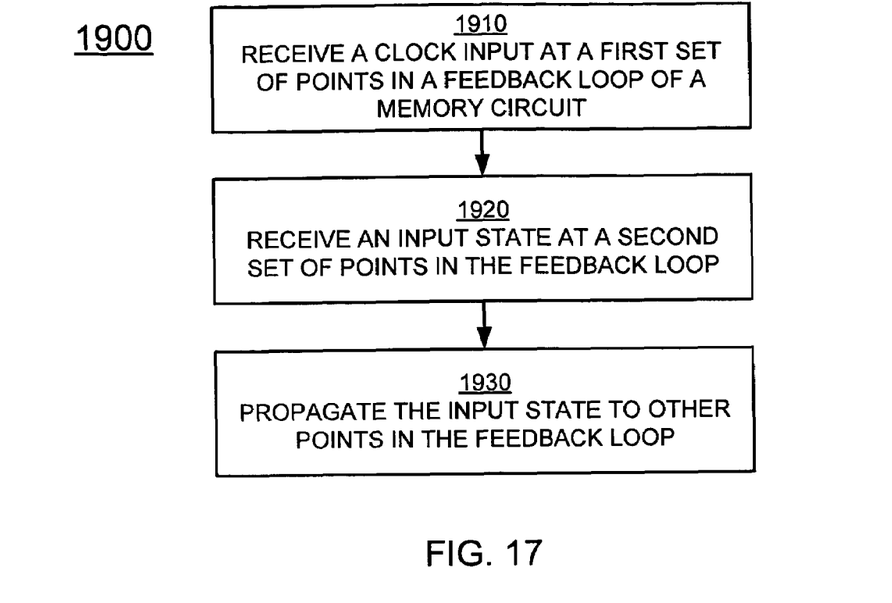
FIG. 17 is a flowchart of a method for writing state to a memory circuit having a data input and a clock input and reduced minimum retention voltage in accordance with one embodiment of the present invention.

FIG. 17 is a flowchart 1900 of a method for writing state to a memory circuit having a data input and a clock input and reduced minimum retention voltage in accordance with one embodiment of the present invention (e.g., the circuits of FIGS. 5-8). Although specific steps are disclosed in flowchart 1900, such steps are exemplary. That is, embodiments in accordance with the present invention are well-suited to performing various other steps or variations of the steps recited in flowchart 1900. It is appreciated that the steps in flowchart 1900 may be performed in an order different than presented and that the steps in flowchart 1900 are not necessarily performed in the sequence illustrated.

In step 1910 of FIG. 17, a clock input is received at a first set of multiple points in a state-storage feedback loop of a memory circuit.

In step 1920, a data input is received at a second set of multiple points on the feedback loop. In one embodiment, the data input is received at alternate circuit elements of the feedback loop. For example, the feedback loop may include a same number of inverters and three-state inverters coupled alternately in series. The data input is received at the inputs of the inverters.

In step 1930, the data input is propagated from the second set of multiple points to other points in the feedback loop.

Figure 18:
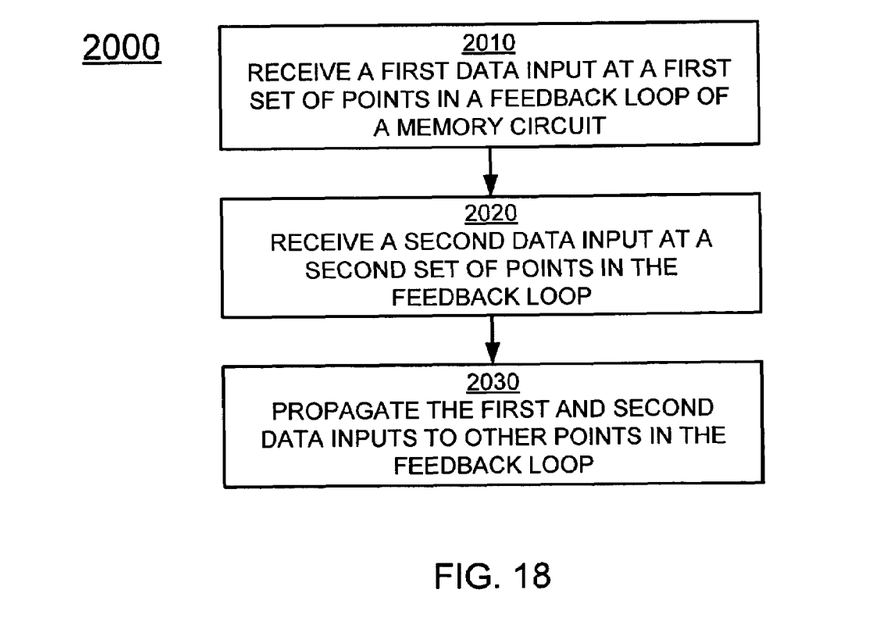
FIG. 18 is a flowchart of a method for writing state to a memory circuit having first and second data inputs and reduced minimum retention voltage in accordance with one embodiment of the present invention.

FIG. 18 is a flowchart 2000 of a method for writing state to a memory circuit having first and second data inputs and reduced minimum retention voltage in accordance with one embodiment of the present invention (e.g., the circuits of FIGS. 11-16). Although specific steps are disclosed in flowchart 2000, such steps are exemplary. That is, embodiments in accordance with the present invention are well-suited to performing various other steps or variations of the steps recited in flowchart 2000. It is appreciated that the steps in flowchart 2000 may be performed in an order different than presented and that the steps in flowchart 2000 are not necessarily performed in the sequence illustrated.

In step 2010 of FIG. 18, a first data input is received at a first set of multiple points in a state-storage feedback loop of a memory circuit.

In step 2020, a second data input is received at a second set of multiple points in the feedback loop.

In step 2030, the first and second data inputs are propagated from the first and second sets of points to other points in the feedback loop.

In summary, embodiments in accordance with the present invention can reduce the time needed to secure a new state in a feedback loop of a memory circuit.

Embodiments in accordance with the present invention are thus described. While the present invention has been described in particular embodiments, it should be appreciated that the present invention should not be construed as limited by such embodiments, but rather construed according to the below claims.

The invention claimed is:

1. A memory circuit comprising:
a state-storage feedback loop having a first data input and a second data input, wherein said state-storage feedback loop comprises a plurality of stages coupled in series, each stage comprising an OR gate having an output coupled to an input of a NAND gate, wherein said first data input is input to said NAND gate in each of said stages and wherein said second data input is input to said OR gate in each of said stages, wherein a first value at said first data input is introduced concurrently into said state-storage feedback loop at first multiple points on said state-storage feedback loop and wherein a second value at said second data input is introduced concurrently into said feedback loop at second multiple points on said state-storage feedback loop.

2. The memory circuit of claim 1 wherein each of said stages further comprises an inverter comprising an output coupled to an input of said OR gate and an input coupled to an output of a NAND gate of another of said stages.

3. The memory circuit of claim 1 wherein said first data input comprises a set-bar signal and said second data input comprises a reset signal.

4. A memory circuit comprising:
a state-storage feedback loop comprising a plurality of stages, wherein each of said stages comprises an OR gate comprising an output coupled to an input of a NAND gate;
a first data input coupled to each of said stages, wherein a first state at said first data input is written in parallel into each of said stages, wherein said first data input is an input of said NAND gate in each of said stages; and
a second data input coupled to said stages, wherein a second state at said second data input is written in parallel into each of said stages, wherein said second data input is an input of said OR gate in each of said stages.

5. The memory circuit of claim 4 wherein each of said stages further comprises an inverter comprising an output coupled to an input of said OR gate and an input coupled to an output of a NAND gate of another of said stages.

6. The memory circuit of claim 4 wherein said first data input comprises a set-bar signal and said second data input comprises a reset signal.

7. A method of writing state to a memory circuit, said method comprising:
receiving a first data input at a first plurality of points in a state-storage feedback loop of said memory circuit, wherein said state-storage feedback loop comprises a plurality of stages coupled in series, each stage comprising an AND gate having an output coupled to an input of a NOR gate, wherein said first data input is sensed in parallel at each of said first plurality of points and wherein said first data input is input to said AND gate in each of said stages;
receiving a second data input at a second plurality of points in said state-storage feedback loop, wherein said second data input is sensed in parallel at each of said second plurality of points and wherein said second data input is input to said NOR gate in each of said stages; and
propagating said first and second data inputs from said first and second pluralities of points to other points in said state-storage feedback loop.

8. A memory circuit comprising:
a state-storage feedback loop having a first data input and a second data input, wherein said state-storage feedback loop comprises a plurality of stages coupled in series, each stage comprising an AND gate having an output coupled to an input of a NOR gate, wherein said first data input is input to said AND gate in each of said stages and wherein said second data input is input to said NOR gate in each of said stages, wherein a first value at said first data input is introduced concurrently into said state-storage feedback loop at first multiple points on said state-storage feedback loop and wherein a second value at said second data input is introduced concurrently into said feedback loop at second multiple points on said state-storage feedback loop.

9. The memory circuit of claim 8 wherein each of said stages further comprises an inverter comprising an output coupled to an input of said AND gate and an input coupled to an output of a NOR gate of another of said stages.

10. The memory circuit of claim 8 wherein said first data input comprises a set-bar signal and said second data input comprises a reset signal.

11. A memory circuit comprising:
a state-storage feedback loop comprising a plurality of stages, wherein each of said stages comprises an AND gate comprising an output coupled to an input of a NOR gate;
a first data input coupled to each of said stages, wherein a first state at said first data input is written in parallel into each of said stages, wherein said first data input is an input of said AND gate in each of said stages; and
a second data input coupled to said stages, wherein a second state at said second data input is written in parallel into each of said stages, wherein said second data input is an input of said NOR gate in each of said stages.

12. The memory circuit of claim 11 wherein each of said stages further comprises an inverter comprising an output coupled to an input of said AND gate and an input coupled to an output of a NOR gate of another of said stages.

13. The memory circuit of claim 11 wherein said first data input comprises a set-bar signal and said second data input comprises a reset signal.

14. A method of writing state to a memory circuit, said method comprising:
receiving a first data input at a first plurality of points in a state-storage feedback loop of said memory circuit, wherein said state-storage feedback loop comprises a plurality of stages coupled in series, each stage comprising an OR gate having an output coupled to an input of a NAND gate, wherein said first data input is sensed in parallel at each of said first plurality of points and wherein said first data input is input to said OR gate in each of said stages;
receiving a second data input at a second plurality of points in said state-storage feedback loop, wherein said second data input is sensed in parallel at each of said second plurality of points and wherein said second data input is input to said NAND gate in each of said stages; and
propagating said first and second data inputs from said first and second pluralities of points to other points in said state-storage feedback loop.

* * * * *